United States Patent
Kang

(10) Patent No.: US 6,844,587 B2
(45) Date of Patent: Jan. 18, 2005

(54) NON-VOLATILE MEMORY DEVICE HAVING IMPROVED PROGRAMMING AND ERASING CHARACTERISTICS AND METHOD OF FABRICATING THE SAME

(75) Inventor: Sung-taeg Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/626,113

(22) Filed: Jul. 24, 2003

(65) Prior Publication Data

US 2004/0119109 A1 Jun. 24, 2004

(30) Foreign Application Priority Data

Sep. 17, 2002 (KR) .................................. 10-2002-0056624

(51) Int. Cl.⁷ ............................................. H01L 29/788
(52) U.S. Cl. ...................... 257/316; 257/317; 257/315; 438/266
(58) Field of Search ................................ 257/316, 317, 257/315; 438/266

(56) References Cited

U.S. PATENT DOCUMENTS

| 5,768,192 A | 6/1998 | Eitan ...................... 365/185.24 |
| 6,093,945 A | * 7/2000 | Yang ........................... 257/317 |
| 6,335,554 B1 | * 1/2002 | Yoshikawa ................... 257/316 |

FOREIGN PATENT DOCUMENTS

| JP | 2001-156188 | 6/2001 | ....... H01L/21/8247 |
| JP | 2001-230332 | 8/2001 | ....... H01L/21/8247 |

* cited by examiner

Primary Examiner—Hoai Ho
Assistant Examiner—Tu-Tu Ho
(74) Attorney, Agent, or Firm—F. Chau & Associates LLC

(57) ABSTRACT

A non-volatile memory device and a fabrication method thereof, wherein a charge trapping layer, which is a memory unit, is formed at opposite ends of a gate of a cell, i.e., adjacent to source and drain junction regions, such that portions of the charge trapping layer adjacent to the source and drain junction regions are formed to be thicker than other portions of the charge trapping layer. Therefore, regions adjacent to junction regions function as electron storage regions and hole filing regions.

13 Claims, 4 Drawing Sheets

NON-VOLATILE MEMORY DEVICE HAVING IMPROVED PROGRAMMING AND ERASING CHARACTERISTICS AND METHOD OF FABRICATING THE SAME

BACKGROUND OF THE INVENTION

1. Field of the Invention

The present invention relates to a non-volatile memory device, and more particularly, to an electrically erasable programmable read-only memory (EEPROM) having improved programming and erasing characteristics and a method of fabricating same.

2. Description of the Related Art

A non-volatile memory device is a device in which data is not erased even if a supply of power is discontinued. EEPROM is a type of read-only memory ("ROM") that is non-volatile and electrically erasable and programmable. In general, data in the cells of an EEPROM can be erased upon localized application of an electric field to each cell. The basic structure of an EEPROM cell may include an oxide layer sandwiched between two transistors. The two transistors are known as a control gate and a floating gate, respectively.

As the integration density of semiconductor memory devices increases, smaller floating gates must be used. However, a high voltage is needed to program a non-volatile memory or erase data from the non-volatile memory, and the smaller floating gates make it difficult to maintain boundaries when defining a tunnel. Thus, reducing the size of a floating gate makes it almost impossible to program or erase data from an EEPROM. For this reason, non-volatile memory devices, such as silicon-oxide-nitride-oxide-silicon (SONOS), ferro-electric random-access memory (FeRAM), single-electron transistor (SET), and non-volatile read-only memory (NROM) devices, which are substitutes for the floating gate type cell, have been developed. In particular, much attention is being focused on the SONOS cell as a next-generation cell that can replace the floating gate type cell.

A typical SONOS EEPROM is shown in FIG. 1. Referring to FIG. 1, an oxide-nitride-oxide (ONO) layer 47 and a control gate 50 are formed on a substrate 1. The ONO layer 47 is a stacked structure of a lower oxide layer 10, a nitride layer 40, and an upper oxide layer 45. A source junction region 90 and a drain junction region 95 are formed in the substrate 1 at opposite sides of the ONO layer 47.

The lower oxide layer 10 is a tunneling layer. The nitride layer 40 is a memory (storage) layer that stores an electric charge or discharges the electric charge from a trap site so as to control a threshold voltage of a cell. That is, the nitride layer 40 acts as a memory unit. The upper oxide layer 45 is a blocking layer that prevents an electric charge from escaping the ONO layer 47.

A non-volatile memory is programmed using Fowler-Nordheim tunneling (F-N tunneling) or channel hot electron (CHE) injection, whereby electrons, for example, collect in the ONO layer 47. In general, CHE injection is preferred to F-N tunneling, which requires a high voltage.

In a conventional SONOS EEPROM in which the ONO layer 47 formed below the control gate 50 has a flat-stacked structure, either voltage applied to the control gate 50 must be increased or the ONO layer 47 must be thinned in order to enhance programming efficiency. However, thinning of the ONO layer 47 decreases charge retention, thereby lowering reliability.

In an effort to address the problems of the conventional SONOS cell, U.S. Pat. No. 5,768,192 to Eitan relates to programming and reading operations performed on a non-volatile semiconductor memory device in asymmetrical ways. That is, if a non-volatile semiconductor memory device is programmed using CHE injection, electrons are stored only in regions adjacent to drain regions. A difference in threshold voltage between locally charged regions is measured to distinguish between cells having a value of "0" (i.e., a programmed state wherein electric charge is prevented from passing to the control gate) and cells having a value of "1" (i.e., a blank state wherein electric charge is able to pass to the control gate. A lateral electric field generated when a voltage is applied to a source region of a nitride layer, i.e., a region that is not charged with electrons, is weaker than a lateral electric field generated when a voltage is applied to a drain region of the nitride layer. Therefore, it is possible to obtain a better cell window (i.e., an opening allowing electrical connection between layers) by applying a voltage to the source region of the nitride layer. However, if the size of a cell, i.e., channel length or distance between the source and drain, is smaller than a predetermined size, problems such as punch through or junction breakdown are caused when a voltage is applied to the cell via a thick ONO layer during CHE injection. In this case, it is impossible to perform ion implantation around the cell. However, a problem exists in that because an electron storage region is wider, the operation of a conventional non-volatile semiconductor memory device depends largely on the length of a nitride layer. Further, the range of a hole filling region is limited to an area around a junction region.

SUMMARY OF THE INVENTION

The present invention provides a non-volatile memory device which has an ultra-short channel compared to a conventional non-volatile memory device and whose operation does not depend on the length of a nitride layer.

The present invention also provides a method of fabricating a non-volatile memory device that can be used to more evenly form a cell.

A non-volatile memory device according to the present invention is obtained by defining an electron storage region adjacent to source and drain junction regions and lengthening a hole filling region in the vertical direction. According to one aspect of the present invention, there is provided a non-volatile memory device in which a lower oxide layer, a charge trapping layer, an upper oxide layer, and a control gate are sequentially stacked on a substrate, and source and drain junction regions are formed at opposite sides of the stacked structure, wherein portions of the charge trapping layers adjacent to the source and drain junction regions are thicker than remaining portions of the charge trapping layer.

According to a preferred embodiment of the present invention, there is provided a non-volatile memory device comprising: an ion implantation layer for controlling a threshold voltage formed in a substrate; a lower oxide layer formed on the ion implantation layer; a charge trapping layer formed on the lower oxide layer and having two portions thereof shaped like two spacers facing each other, the two spacers each having an inner portion that is shorter than an outer portion; an upper oxide layer formed along the charge trapping layers and the lower oxide layer; a control gate that is self-aligned on the upper oxide layer and has a flat upper surface; and source and drain junction regions formed in the substrate at opposite sides of the ion implantation layer.

The charge trapping layer, which is a memory unit, is formed adjacent to opposite sides of a gate of a cell, i.e., adjacent to source and drain junction regions, such that portions of the charge trapping layer which contact the source and drain junction regions are more thickly formed than remaining portions of the charge trapping layer. Accordingly, regions adjacent to junction regions function both as the electron storage region and the hole filling region.

According to another aspect of the present invention, there is provided a method of fabricating a non-volatile memory device, in which a gate is formed without a photolithography process and thus cells can be evenly formed without misalignment. According to the method, a method of fabricating a non-volatile memory device, comprises: forming a lower oxide layer on a substrate; forming a sacrificial layer on the lower oxide layer and patterning the sacrificial layer to form an opening; forming a charge trapping layer shaped like at least two spacers along an inner wall of the opening: forming an upper oxide layer to cover the sacrificial layer and the charge trapping layer, such that the opening is not completely filled with the upper oxide layer; forming a polysilicon layer on the upper oxide layer to fill the opening; planarizing an upper surface of the polysilicon layer until the sacrificial layer is exposed, so as to form a self-aligned control gate in the opening; removing the sacrificial layer and the lower oxide layer which is formed below the sacrificial layer; and forming source and drain junction regions in the substrate at opposite sides of the control gate.

Before forming the charge trapping layers, ions may be implanted into the opening in the substrate to control a threshold voltage. It is preferable that the sacrificial layer is formed of a material that can be selectively etched with respect to the charge trapping layers. For instance, the sacrificial layer is an oxide layer, and the charge trapping layer is one of a silicon nitride layer, a silicon oxy nitride layer, a layer containing polysilicon dots, or a layer including nitride dots.

The spacer-type charge trapping layers may be formed using etch back or slope etch processes, and the height of the spacer-type charge trapping layers may be adjusted using the etch back process after the formation thereof. It is preferable that the planarization of the polysilicon layer is performed using chemical mechanical polishing (CMP). If necessary, the planarization is performed until the charge trapping layers are exposed. Also, after the formation of the control gate, metal may be applied to the control gate to form a silicide, i.e., the control gate may undergo silicidation. In a method of fabricating non-volatile memory device according to the present invention, a charge trapping layers is formed at opposite sides of a gate of a cell, i.e., adjacent to source and drain junction regions. The charge trapping layer may be shaped like two spacers. Also, an opening is defined by a sacrificial layer and the inside of the opening is filled with the charge trapping layer, thereby enabling more even formation of a cell without misalignment. Further, the inside of the opening is filled with a polysilicon layer and planarized to form a control gate. Accordingly, a gate can be made without a gate forming mask and a photolithography process, thereby preventing problems caused by the photolithography process.

BRIEF DESCRIPTION OF THE DRAWINGS

Preferred embodiments of the present invention can be understood in more detail from the following descriptions taken in conjunction with the accompanying drawings in which.

DETAILED DESCRIPTION OF THE PREFERRED EMBODIMENTS

Figure 1:
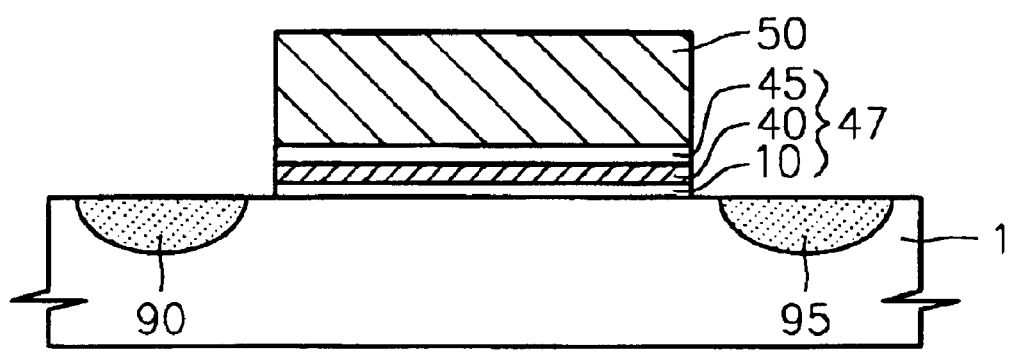
FIG. 1 is a cross-sectional view of a prior art version of a SONOS EEPROM.

Preferred embodiments of the present invention will be described below in more detail with reference to the accompanying drawings. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the thickness of layers and regions may be exaggerated for clarity. Like reference numerals refer to like elements throughout the specification.

Figure 2:
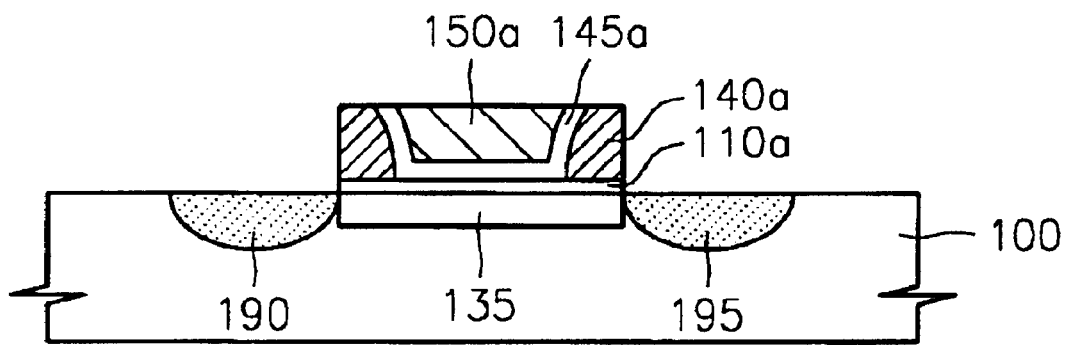
FIG. 2 is a cross-sectional view of a SONOS EEPROM according to an embodiment of the present invention.

FIG. 2 is a cross-sectional view of a SONOS EEPROM according to a first embodiment of the present invention. Referring to the SONOS EEPROM of FIG. 2, a stacked structure, in which a lower oxide layer 110a, a charge trapping layer 140a, an upper oxide layer 145a, and a control gate 150a are sequentially formed, is formed on a substrate 100, and a source junction region 190 and a drain junction region 195 are formed in the substrate 100 at opposite sides of the stacked structure. Preferably, the SONOS EEPROM further includes an ion implantation layer 135 in the substrate 100 for controlling a threshold voltage,. In detail, the ion implantation layer 135 is formed below the lower oxide layer 110a, which is a tunneling oxide layer, and between the source/drain junction regions 190 and 195.

The charge trapping layer 140a is a memory layer shaped like spacers formed on the lower oxide layer 110a such that the spacers face each other. The inside surface of each spacer of the charge trapping layer 140a curves outward such that its width decreases from bottom to top. Also, the charge trapping layer 140a stores electrons in or discharges electrons from trap sites. Thus, the charge trapping layer 140a may include silicon nitride, silicon oxy nitride, polysilicon dots, or nitride dots. The upper oxide layer 145a is a blocking layer that is formed to cover the charge trapping layer 140a and the lower oxide layer 110a to prevent loss of electric charge from the charge trapping layer 140a. The control gate 150a formed on the upper oxide layer 145a is self-aligned with respect to the upper oxide layer 145a, and has a flat upper portion. It is preferable that upper surfaces of the charge trapping layer 140a, the upper oxide layer 145a, and the control gate 150a are level with one another.

As mentioned above, a SONOS EEPROM according to the first embodiment of the present invention includes a thicker portion of the charge trapping layer 140a, i.e., memory layer, formed next to the source and drain junction regions 190, 195. Therefore, it is possible to enable regions adjacent to the source and drain junction regions 190, 195 to function as both an electron storage region and a hole filling region. Therefore, unlike a conventional SONOS EEPROM, the operation of the SONOS EEPROM according to the present invention does not depend on the length of a nitride layer, i.e., a memory layer. Also, the size of the hole filling region is increased in the vertical direction and the electron storage region is limited in the vertical direction, thereby enabling fast programming and erasing at a lower voltage. If the charge trapping layer 140a is short in length, its size can be increased by increasing its height. Therefore, it is possible to store or discharge a large number of electric charges in the charge trapping layer 140a, thereby enabling the forming of an ultra-short channel. For this reason, a SONOS EEPROM according to the first embodiment of the present invention has a high efficiency, high endurance, and high cell integration density, which enables 2-bit operations of memory.

FIGS. 3 through 10 are cross-sectional views of a SONOS EEPROM for use in explaining steps in a method of fabricating same, according to a second embodiment of the present invention.

Figure 3:
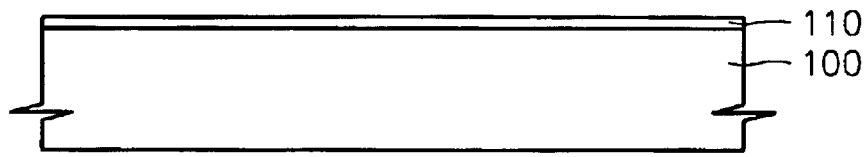
FIGS. 3 through 10 are cross-sectional views of a SONOS EEPROM for use in explaining steps in a method of fabricating same according to an embodiment of the present invention.

Referring to FIG. 3, a lower oxide layer 110, which is a tunneling oxide layer, is formed on a substrate 100. The lower oxide layer 110 may be obtained by thermally oxidizing an upper portion of the substrate 100 or by forming a middle temperature oxide (MTO) layer to a thickness from about 20 Å to about 80 Å using low-pressure chemical vapor deposition (LPCVD) and annealing the MTO layer. The annealing process may be performed in an atmosphere of $N_2O$, $NO$, $NH_3$, or a mixture thereof. An MTO layer deposited without having been annealed is prone to having defects such as dangling bonds. Such defects can be removed by performing the annealing process on the MTO layer in the above gas atmosphere, thereby enhancing the reliability of the MTO layer.

Figure 4:
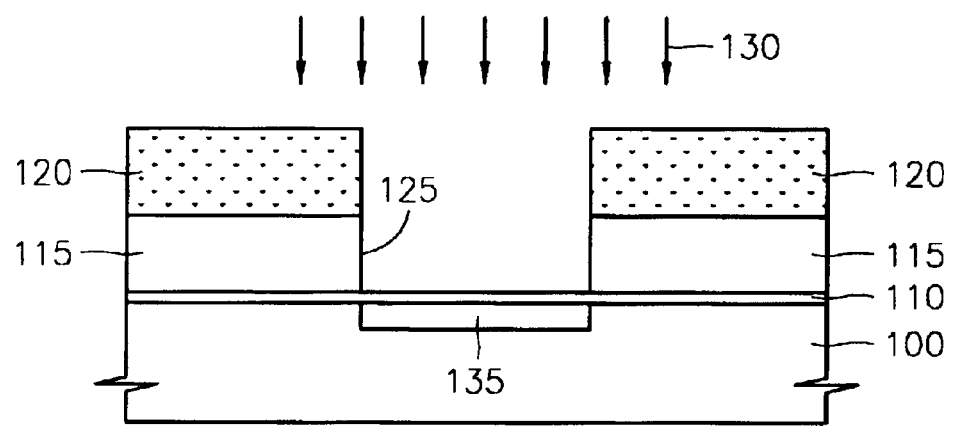

Next, as shown in FIG. 4, a sacrificial layer 115, which is to be selectively etched with respect to a charge trapping layer to be formed thereafter, is formed on the lower oxide layer 110, and a photoresist layer 120 is formed on the sacrificial layer 115. Next, the photoresist layer 120 is patterned using a predetermined mask and an exposed portion of the sacrificial layer 115 is etched using the patterned photoresist layer 120 as an etch mask, thereby forming an opening 125. The sacrificial layer 115 may be an oxide layer and formed to a thickness from about 100 Å to about 500 Å. The opening 125 may be etched using dry etching or both the dry etching and wet etching. Preferably, the sacrificial layer 115 is formed of an oxide, such as boron phosphorus silicate glass (BPSG) or undoped silicate glass (USG), that can be easily etched. Alternatively, the sacrificial layer 115 may be formed of a material, e.g., polysilicon, that can be selectively etched with respect to the charge trapping layer which is to be formed in a subsequent process.

Next, an ion implantation layer 135 is formed in the substrate 100 by implanting impurity ions 130 into the resultant structure using the photoresist layer 120 as an ion implantation mask so as to adjust a threshold voltage. For instance, boron (B) ions or other p-type impurities are implanted into the substrate 100 to a desired depth or so that the substrate 100 may have desired impurity concentration. By means of such ion implantation, the threshold voltage is controlled to increase hot hole injection efficiency.

Figure 5:
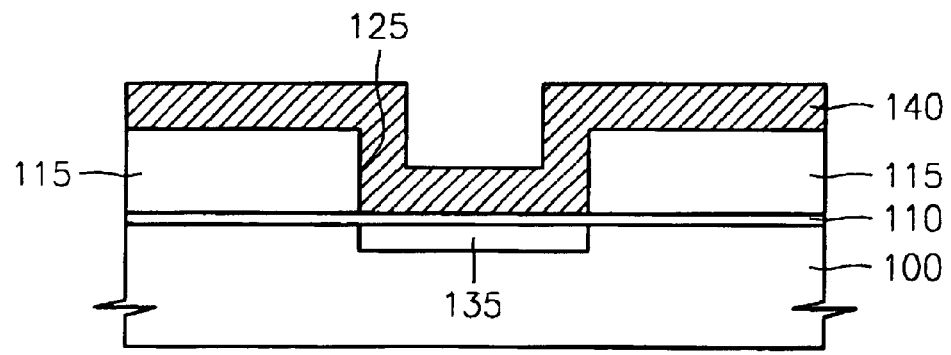

Thereafter, referring to FIG. 5, the photoresist layer 120 is completely removed using ashing and an organic strip, and a layer 140 that will result in the charge trapping layer 140a is deposited over the substrate 100. The layer 140 will become a memory layer, i.e., a charge trapping layer of a memory cell, and is formed of silicon nitride using LPCVD. Alternatively, the layer 140 may be a silicon oxy nitride layer, a layer containing polysilicon dots, or a layer containing nitride dots. The thickness of the layer 140 is determined so that the layer 140 does not completely cover the opening 125. For instance, the layer 140 is formed to a thickness from about 100 Å to about 500 Å.

Figure 6:
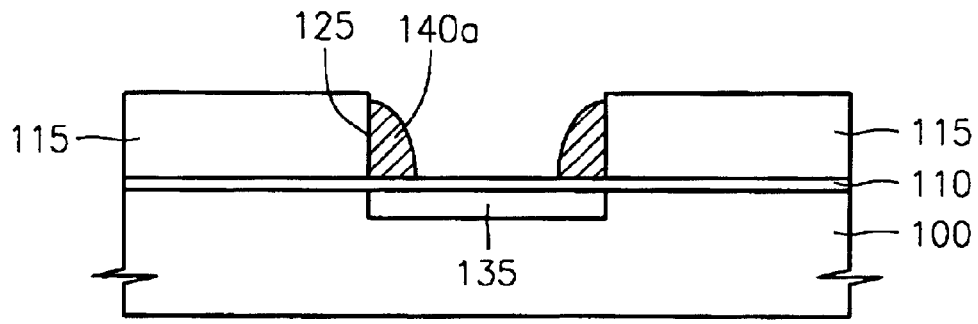

Referring to FIG. 6, the layer 140 is partially removed using an etch back or slope etch method to form a charge trapping layer 140a shaped like spacers along the inner wall of the opening 125. Here, slope etch refers to an etching method in which a target object is etched to have a slope by controlling the flow of etch gas by adjusting a bias voltage applied to the substrate 100. If necessary, the height of the charge trapping layers 140a may be controlled using etch back. In other words, the charge trapping layer 140a is etched to be shaped like spacers and then further etched to make the height thereof lower than the inner wall of the opening 125. Using one of the above two ways, the charge trapping layer 140a can be evenly formed without misalignment because a photolithography process is not used.

Figure 7:
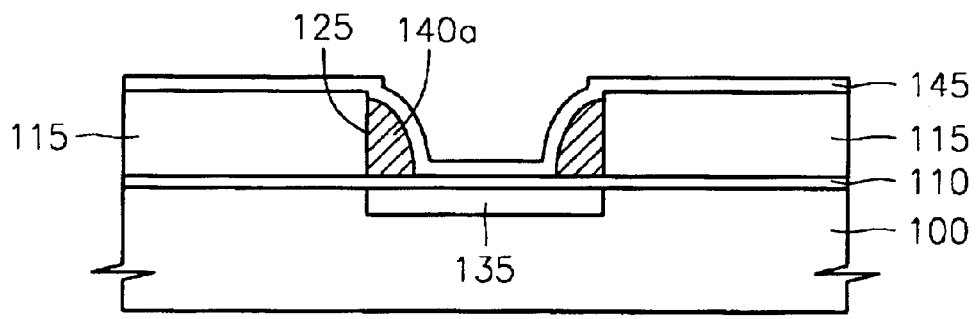

Next, as shown in FIG. 7, an upper oxide layer 145 is formed. The upper oxide layer 145 is a blocking layer that prevents stored electrons from escaping. For instance, the upper oxide layer 145 may be formed by depositing MTO or high temperature oxide (HTO) to a thickness from about 40 Å to about 100 Å over the substrate 100, and performing an annealing process, thermal treatment such as oxidation, or oxy nitrification using $NO_2$ or $NH_3$ on the MTO or HTO to increase the density of the MTO or HTO.

Figure 8:
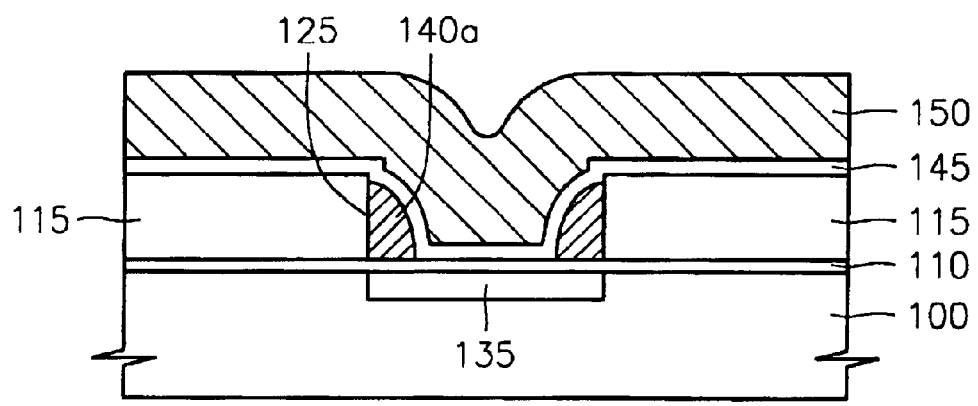

Next, referring to FIG. 8, a polysilicon layer 150, which will become a gate electrode, is deposited to completely fill the opening 125. The polysilicon layer 150 may be obtained by depositing polysilicon, which does not contain impurities, at a temperature from 500° C. to 700° using LPCVD. Then, the polysilicon layer 150 may be doped with arsenic (As) or phosphorous (P) using ion implantation to create conductivity. Otherwise, the polysilicon layer 150 may be doped with impurities in-situ during the deposition of the polysilicon layer 150.

Figure 9:
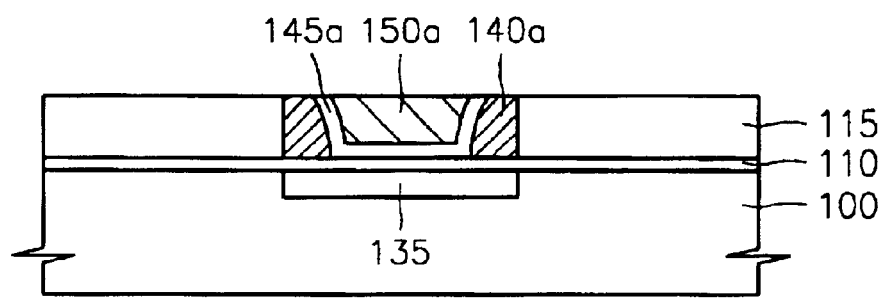

Referring to FIG. 9, an upper surface of the resultant structure of FIG. 8 is planarized using chemical mechanical polishing (CMP) to form a control gate 150a thereon. As shown in FIG. 9, the upper surface of the resultant structure of FIG. 8 may be planarized until an upper surface of the charge trapping layer 140a is exposed. In FIG. 9, reference numeral 145a denotes an upper oxide layer patterned during CMP. Therefore, the control gate 150a can be formed to be self-aligned without using a gate forming mask. Thus, a cell can be more evenly formed without misalignment. Also, a photolithography process is not required in forming the control gate 150a, and thus, problems due to the photolithography process do not occur.

Figure 10:
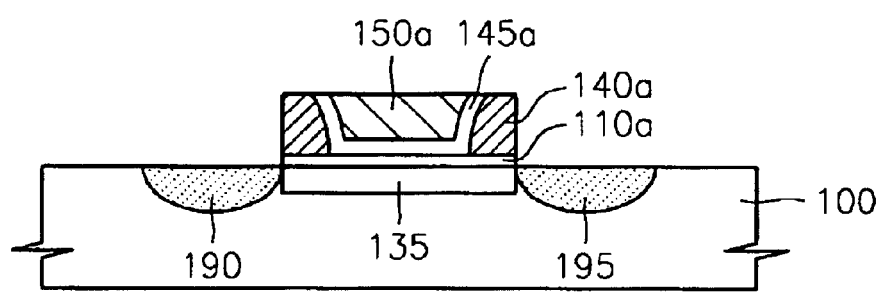

Referring to FIG. 10, the sacrificial layer 115 and the lower oxide layer 110, which is formed below the sacrificial layer 115, are removed and ion implantation is performed on the substrate 100 to form a source junction region 190 and a drain junction region 195. Reference numeral 110a denotes a lower oxide layer remaining after the removal. If the sacrificial layer 115 is an oxide layer, the sacrificial layer 115 may be etched selectively with respect to the charge trapping layer 140a, using a mixture of $H_2O$ and HF. If the sacrificial layer 115 is formed of a soft material such as BPSG or USG and the lower and upper oxide layers 110a and 145a are formed of a hard material such as MTO or HTO, it is possible to reduce damage to the lower and upper oxide layers 110a and 145a when removing the sacrificial layer 115. When the sacrificial layer 115 is an oxide layer, the sacrificial layer 115 is removed as described above. However, when the sacrificial layer 115 is a polysilicon layer, it must be removed before the deposition of the polysilicon layer 150, which will become a gate electrode. The sacrificial layer 115, which is formed of polysilicon, may be removed using a mixture of $HNO_3$ and HF, or $NH_4OH$.

A process of converting the control gate 150a into a silicide compound, i.e., silicidation, may be further performed after formation of the source and drain junction regions 190 and 195. In this case, the control gate 150a may be changed into cobalt silicide (CoSix), tungsten silicide (Wsix), titanium silicide (TiSix), or the like. Such a silicide can be obtained by applying metal, such as cobalt, tungsten, or titanium, onto the control gate 150a, which is formed of polysilicon, and then performing rapid thermal annealing (RTA) on the resultant structure so the applied metal reacts with silicon supplied from the polysilicon. For instance, RTA is performed at a temperature from about 800° C. to about 850° C. for about 20 seconds. A portion of the metal which does not react with the silicon may be removed using a mixture of $NH_4OH$, $H_2O_2$, and $H_2O$. The obtained silicide has lower resistance than doped polysilicon, and thus, the driving speed of a device can be increased using the silicide control gate 150a.

In a SONOS EEPROM according to the second embodiment of the present invention, spacer-type portions of the charge trapping layer 140a are formed at opposite sides of a gate of a cell, i.e., adjacent to source and drain junction regions 190, 195. Thus, one region acts as both an electron storage region and a hole filling region, thereby increasing cell efficiency. Also, a sacrificial layer 115 is formed to define an opening 125 and a charge trapping layer 140a is formed in a spacer shape in the opening 125. Therefore, it is possible to evenly fabricate a cell without misalignment. Further, a control gate 150a is obtained by filling the inside of the opening 125 with a polysilicon layer 150 and planarizing the polysilicon layer. That is, a gate can be made without a gate forming mask and a photolithography process, thus preventing problems caused during the photolithography process.

Figure 11:
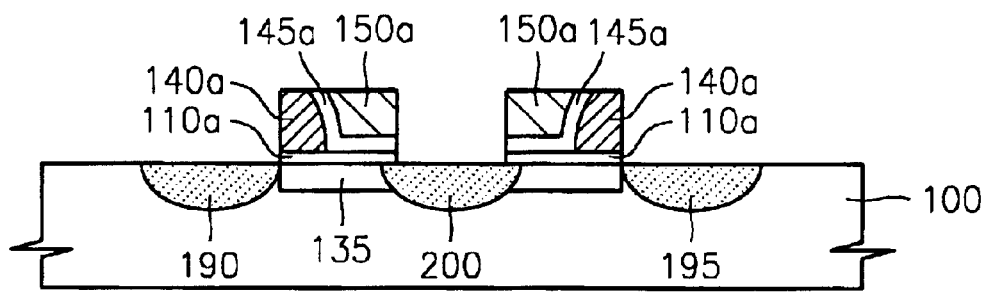
FIG. 11 is a cross-sectional view of a SONOS EEPROM according to another embodiment of the present invention.

FIG. 11 is a cross-sectional view of a SONOS EEPROM fabricated according to a third embodiment of the present invention.

First, the processes described with reference to FIGS. 3 through 10 are carried out. Next, the sacrificial layer 115 and the lower oxide layer 110 formed below the sacrificial layer 115 shown in FIG. 10 are removed. Concurrently with the removal of the sacrificial layer 115 and the lower oxide layer 110, or before or after the removal, a central portion of a control gate 150a is etched using a photolithography process in order to expose the substrate 100, as shown in FIG. 11. Thereafter, ion implantation is performed over the substrate 100 to form source and drain junction regions 190 and 195 and a common source and drain junction region 200 in the substrate 100. In this way, a 1-bit operational SONOS EEPROM can be obtained.

The above method is almost identical to the method according to the second embodiment, except that a photography process is used to etch a central portion of the control gate 150a.

In a SONOS EEPROM according to the present invention, regions adjacent to junction regions function as both an electron storage region and a hole filling region, thereby increasing the efficiency of a cell. In other words, the efficiency of a cell is increased because electrons are charged in a nitride layer of a small size in a non-volatile semiconductor device.

In particular, spacer like portions of the charge trapping layer 140a are formed at opposite ends of a gate of a cell, i.e., adjacent to source and drain junction regions 190, 195, such that portions of the charge trapping layer 140a adjacent to the source and drain junction regions 190, 195 are formed to be thicker than other portions of the charge trapping layer 140a. In this case, the hole filling region increases in a vertical direction, and thus, a programmed region can be effectively erased using hot hole injection. For this reason, programming and erasing (or endurance) characteristics of a SONOS EEPROM according to the present invention are improved.

Also, if the charge trapping layer 140a is short in length, the height thereof can be sufficiently increased to enable the charging or discharging of a large number of electrons. A reduction in the length of a channel makes it possible to highly integrate a non-volatile semiconductor device.

Further, in a method of fabricating a SONOS EEPROM according to the present invention, trapping layers 140a are formed at opposite ends of a gate without misalignment and a gate forming mask is not used in fabricating a control gate 150a, thereby more evenly forming a cell. In addition, problems due to a photolithography process are not caused because the photolithography process is not required, and ion implantation can be easily accomplished around a channel of a cell.

Accordingly, a SONOS EEPROM according to the present invention can be programmed using a low voltage at a high speed and has better programming and erasing characteristics. Also, it is possible to manufacture an ultra-short channel SONOS EEPROM that is highly integrated to enable 1-bit or 2-bit operations of the cell.

Although illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of fabricating a non-volatile memory device, comprising:
    forming a lower oxide layer on a substrate;
    forming a sacrificial layer on the lower oxide layer and patterning the sacrificial layer to form an opening;
    forming a charge trapping layer shaped like at least two spacers along an inner wall of the opening;
    forming an upper oxide layer covering the sacrificial layer and the charge trapping layer, the upper oxide layer fills a portion of the opening;
    forming a polysilicon layer on the upper oxide layer for filling a remaining portion of the opening;
    planarizing an upper surface of the polysilicon layer until the sacrificial layer is exposed to form a self-aligned control gate in the opening;
    removing the sacrificial layer and the lower oxide layer formed below the sacrificial layer; and
    forming a source junction region and a drain junction region in the substrate at opposite sides of the control gate.

2. The method of claim 1, wherein the sacrificial layer is formed of a material capable of being selectively etched with respect to the charge trapping layer.

3. The method of claim 1, wherein the sacrificial layer is an oxide layer.

4. The method of claim 1, wherein the charge trapping layer is one of a silicon nitride layer, a silicon oxy nitride layer, a layer including polysilicon dots, and a layer including nitride dots.

5. The method of claim 1, further comprising performing ion implantation into the opening in the substrate for controlling a threshold voltage.

6. The method of claim 1, wherein the step of forming the charge trapping layer includes:

depositing a layer in the opening, the layer filling only a portion of the opening; and forming spacers along an inner wall of the opening by etching back the layer until an upper surface of the sacrificial layer is exposed.

7. The method of claim 6, further comprising etching back the spacers so that a height of each spacer is less than a height of the inner wall of the opening.

8. The method of claim 1, the step of forming the charge trapping layer includes:

forming a layer in the opening, the layer filing only a portion of the opening; and forming spacers along an inner wall of the opening by slope etching the layer until an upper surface of the sacrificial layer is exposed.

9. The method of claim 8, further comprising etching back the spacers so that a height of each spacer is shorter than a height of the inner wall of the opening.

10. The method of claim 1, wherein the step of planarizing is performed using chemical mechanical polishing.

11. The method of claim 1, wherein the step of planarizing is performed until the charge trapping layer is exposed.

12. The method of claim 1, further comprising performing silicidation on the control gate.

13. The method of claim 1, further comprising:

exposing the substrate by etching a central portion of the control gate; and forming a common source and drain junction in an exposed portion of the substrate.

* * * * *